(12) United States Patent
Ritter (10) Patent No.: US 12,191,344 B2
(45) Date of Patent: Jan. 7, 2025

(54) ELECTROSTATIC DISCHARGE PROTECTION SEMICONDUCTOR STRUCTURE AND A METHOD OF MANUFACTURE

(71) Applicant: NEXPERIA B.V., Nijmegen (NL)

(72) Inventor: Hans-Martin Ritter, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 42 days.

(21) Appl. No.: 17/381,565

(22) Filed: Jul. 21, 2021

(65) Prior Publication Data

US 2022/0028965 A1   Jan. 27, 2022

(30) Foreign Application Priority Data

Jul. 21, 2020   (EP) .................................... 20187046

(51) Int. Cl.
*H01L 27/02* (2006.01)
*H01L 49/02* (2006.01)

(52) U.S. Cl.
CPC .......... *H01L 28/20* (2013.01); *H01L 27/0259* (2013.01); *H01L 27/0288* (2013.01)

(58) Field of Classification Search
CPC . H01L 28/20; H01L 27/0259; H01L 27/0288; H01L 257/577
USPC ...................................................... 257/577
See application file for complete search history.

(56) References Cited

U.S. PATENT DOCUMENTS

| | | | | |
|---|---|---|---|---|
| 4,617,482 A | * | 10/1986 | Matsuda | H03K 19/00315 327/437 |
| 4,672,584 A | * | 6/1987 | Tsuji | H01L 27/0921 327/198 |
| 5,691,555 A | * | 11/1997 | Zambrano | H01L 29/7815 257/334 |
| 6,304,423 B1 | | 10/2001 | Long et al. | |
| 2014/0225220 A1 | * | 8/2014 | Tamagawa | H01L 27/0802 257/529 |
| 2015/0171073 A1 | * | 6/2015 | Hu | H01L 28/20 257/363 |

FOREIGN PATENT DOCUMENTS

| | | | |
|---|---|---|---|
| CN | 1132937 | * | 10/1999 |
| CN | 1162842 | * | 10/1999 |
| EP | 0625797 A1 | | 11/1994 |
| EP | 1603162 A1 | | 12/2005 |
| EP | 2256816 | * | 12/2010 |
| EP | 2765606 A1 | | 8/2014 |
| JP | S62101067 A | | 5/1987 |

(Continued)

OTHER PUBLICATIONS

Extended European Search Report and Written Opinion for corresponding European application EP20187046.6, dated Jan. 13, 2021, 20 pages.

*Primary Examiner* — Sheng-Bai Zhu
(74) *Attorney, Agent, or Firm* — Ruggiero McAllister & McMahon LLC (57) ABSTRACT

A discharge protection semiconductor structure is provided that includes a substrate, a well positioned on the substrate, a first contact diffusion and a second contact diffusion, the first contact diffusion and the second contact diffusion positioned on the top side of the well, and a resistor positioned between the first contact diffusion and a second contact diffusion.

19 Claims, 6 Drawing Sheets

(56) References Cited

FOREIGN PATENT DOCUMENTS

| JP | H0281468 A | | 3/1990 |
|---|---|---|---|
| JP | H04340761 A | | 11/1992 |
| JP | H1168043 | * | 3/1999 |

* cited by examiner

ELECTROSTATIC DISCHARGE PROTECTION SEMICONDUCTOR STRUCTURE AND A METHOD OF MANUFACTURE

CROSS REFERENCE TO RELATED APPLICATION

This application claims the benefit under 35 U.S.C. § 119 (a) of European Application No. 20187046.6 filed Jul. 21, 2020, the contents of which are incorporated by reference herein in their entirety.

BACKGROUND OF THE DISCLOSURE

1. Field of the Disclosure

The present disclosure relates to an electrostatic discharge protection semiconductor structure and a method of forming an electrostatic discharge protection semiconductor structure. The disclosure also relates to an integrated circuit comprising an electrostatic discharge protection semiconductor structure.

2. Description of the Related Art

It is known that high speed data transfer integrated circuits are vulnerable to electrostatic discharge (ESD) events. The internal protection structures must be small, due to the limitations of parasitic line capacitance. Furthermore, because advanced semiconductors are needed for the processing of the high data rates, the maximal clamping voltage and the maximally allowable current at is small.

When an external on-board protection is used, the stress current is shared between the internal protection, which is a part of the integrated circuit, and the external protection device. The larger the impedance in the internal path the higher is the system robustness. But a large impedance in the signal path deteriorates the signal detectability.

A known solution, presented on ESD Symposium 2019, by Worley, proposes to use a diffusion resistor. The resistance of a diffusion resistor is non-linear. For high current densities the electron velocity saturates and the resistance increases. Such a diffusion resistor will present a low impedance during normal data transfer, where low currents, in a range of few mA, are used, whilst giving a high impedance for ESD events, where the currents are higher, e.g. in a rage of few Amperes.

One very important issue with transient voltage suppressor (TVS) clamps is their ability to limit the voltage below the level that can damage a state-of-the-art system on chip (SOC) inputs/outputs (I/O) which can fail at voltages as low as 3.5V. Since lowering the shunt resistance of the TVS to acceptable levels is very difficult, another option is to introduce an attenuation resistor between the TVS and I/O. One option is to use the saturation resistor as a means to protect low level I/Os.

TVS devices are used to protect SOC I/Os that are subject to external product level ESD. In some cases, an SOC I/O can be subject to a peak discharge current of up to 30 A, at a 8 kV level, a contact mode into a short circuit. Meanwhile SOC I/Os can fail at voltages as low as 3.5V. It is impossible for a TVS clamp to clamp the voltage to 3.5V when the input current is over 10 A.

For example, a good TVS clamp with a low shunt resistance of 0.40 including board trace resistance and an offset voltage of 2V when in the triggered state will have a voltage drop of 14V for a 30 A peak discharge current, with an 8 kV contact, assuming no current being shunted into a chip's I/O.

A new method of protecting sensitive SOC I/Os is using an attenuation resistor with a current saturation characteristic.

This can be the N type velocity saturation resistor known for its process simplicity. This analysis will assume that an SOC I/O in question can pass a human body model (HBM) 1 kV spec while it is assumed that at the system level an 8 kV contact discharge will be applied.

Another issue relates to the determination of the failure point of an I/O using empirically based models. Transmission-line pulse (TLP) testing of I/O's that generates failure data is common but translating that data to the failure point for an International Electrotechnical Commission's (IEC) immunity standard on ESD discharge waveform is problematical. One method is to equate the total energy at the failure threshold of a 100 ns TLP discharge to the total energy of a corresponding IEC discharge curve. Unfortunately, the thermal process that causes the failure is not adiabatic and that most of the discharge power is going into the protection network and not into the protected device which usually determines the failure point of the I/O. Another complication is the transient response of the TVS clamp.

The known Nwell resistor can have a current saturation characteristic due to velocity saturation of its electron carriers. The only requirement is to make the N+ to N+ length a few microns or less in order to get the field high enough for velocity saturation to take place before breakdown. Thus, for low field, low current conditions the I-V characteristic is essentially linear which is applicable to normal I/O operation.

For ESD conditions in which the voltage is high the resistor can saturate and limit the current flow into the I/O below failure conditions and allow a voltage increase between the TVS and I/O.

Figure 1:
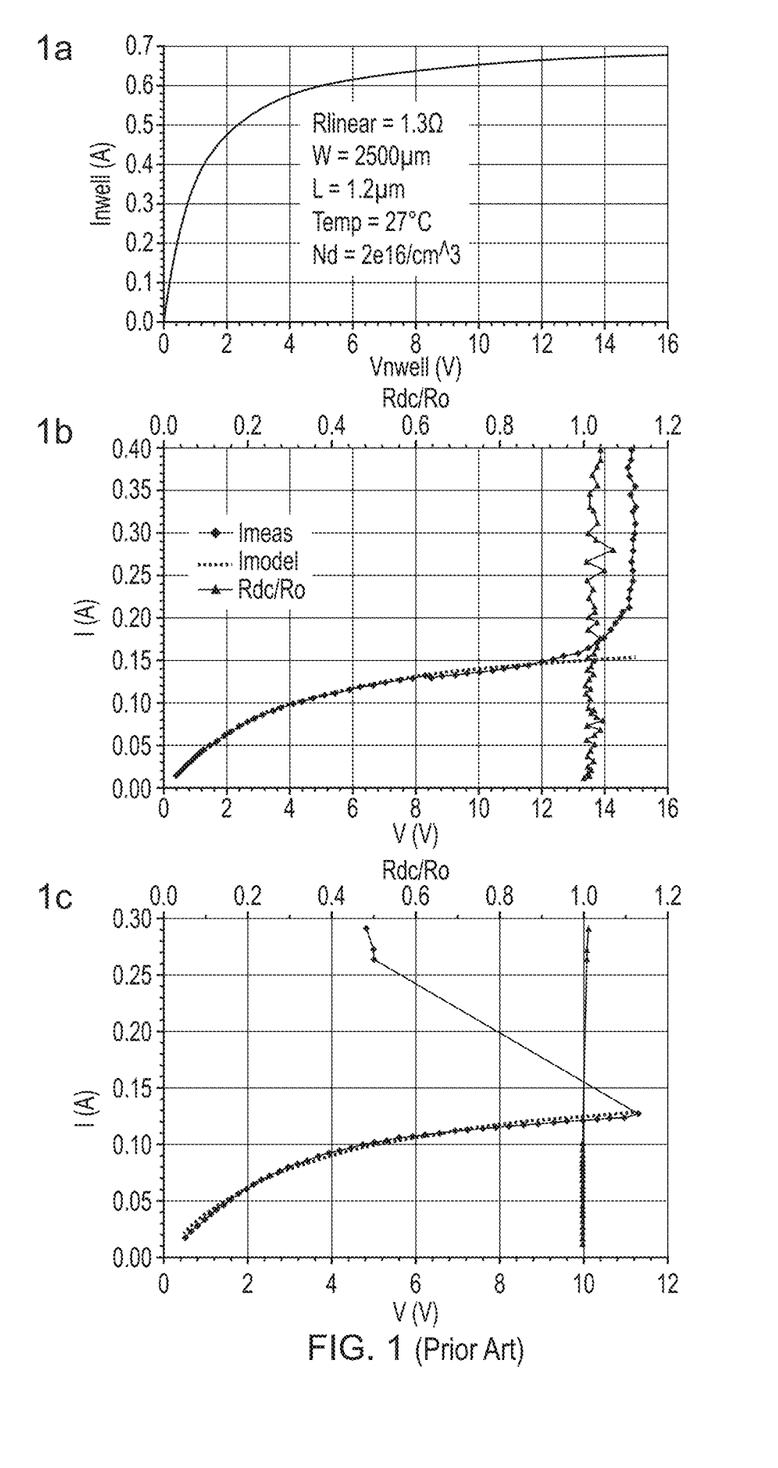
FIGS. 1a, 1b and 1c show I/V diagrams for the known diffusion resistors shown presented on ESD Symposium 2019, by Worley.

An Inwell-Vnwell curve is shown in FIG. 1a. The linear region resistance is 1.30 which is low enough not to interfere with the normal I/O operation. The characteristic impedance of signal lines is typically in the range of 50 to 1000. The saturation current at 16V is 0.68 A which corresponds to the peak current of a 1 k HBM discharge.

FIG. 1b shows an I-V plot of a Nwell resistor made in a generic 180 nm CMOS process using a 1.2 ns vfTLP. FIG. 1c shows I-V plot using TLP data (100 ns) from an N well resistor laid out in a generic 0.18 μm process. Also shown in the plots is the normalized DC resistance, Rdc/Ro (initial R measurement). the vfTLP and TLP curves are essentially the same up to the breakdown point. The vfTLP curve shows a snap-back of breakdown voltage for higher currents.

A methodology was found to allow the voltage drop across a TVS shunt to be much larger than the failure voltage of a protected SOC I/O. The difference between the TVS voltage and the I/O failure voltage limit is absorbed by a velocity saturation resistor. This eliminates the severe voltage drop constraint on the TVS. Most of the power at the pin is absorbed by the ESD clamp circuit and not the protected device A disadvantage is that these diffusion resistors shown presented on ESD Symposium 2019, by Worley is that the avalanche breakdown at high enough currents is combined with snap-back. This limits the usefulness of the diffusion resistor for absorbing the voltage difference between the TVS voltage and the i/o failure voltage. Because of the snap-back such diffusions resistors are frequently destroyed by filamentation.

SUMMARY

Various example embodiments are directed to the disadvantage as described above and/or others which may become apparent from the following disclosure. According to an embodiment of this disclosure a discharge protection semiconductor structure comprises:

a substrate,
a well positioned on the substrate, and
a resistor embedded in the well.

A discharge protection semiconductor structure comprises can further comprise a first contact diffusion and a second contact diffusion, the first contact diffusion and the second contact diffusion positioned on the top side of the well. The resistor can be positioned between the first contact diffusion and the second contact diffusion.

The first contact diffusion and the second contact diffusion can protrude into the well or into the substrate below the well.

The well can be of a first polarity and the resistor can be of a second polarity, the second polarity being inversed in respect to the first polarity.

The doping of the well and the doping of the resistor can be of a similar level. According to an embodiment of the disclosure the substrate is p-doped or n-doped, wherein the well is n-doped, wherein the first contact diffusion and the second contact diffusion are p-doped, and wherein the resistor is p-doped. The scope disclosure is not limited to such a doping arrangement. It includes also an opposite doping arrangement, i.e. the substrate is p-doped or n-doped, wherein the well is p-doped, wherein the first contact diffusion and the second contact diffusion are n-doped, and wherein the resistor is n-doped. It includes also arrangements where the substrate and the well have same polarity, while the contact diffusions and the resistor have the opposite polarity.

According to an embodiment of the disclosure the length of the resistor is in a range between 0.2 µm and 2 µm.

According to an embodiment of the disclosure the width of the resistor is in a range between 0.05 mm and 20 mm.

According to an embodiment of the disclosure the resistor can be doped in a range of 10e17 to 10e19, and the resistor can be of a thickness in a range of 0.01 µm to 0.5 µm.

According to an embodiment of the disclosure the resistor can have a resistance between 0.2 and 10 Ohm for a mA current level.

According to an embodiment of the disclosure the resistor is formed as a multi-finger arrangement.

According to an embodiment of the disclosure the first contact diffusion and the second contact diffusion together with the well form a bipolar transistor with a floating base.

The disclosure also related to an integrated circuit comprising the discharge protection semiconductor structure as disclosed in the above embodiments.

The disclosure also relates to a method of creating a discharge protection semiconductor structure semiconductor as disclosed in the above embodiments.

The disclosure also related to a method of creating an integrated circuit comprising a discharge protection semiconductor structure as disclosed in the above embodiments.

A discharge protection semiconductor structure as disclosed in the above embodiments secures very good, very robust electrostatic discharge protection.

A bipolar transistor as described in the above embodiment has a feature that a breakdown voltage which similar to the breakdown voltage of the resistive layer, which feature provides very robust electrostatic discharge protection.

The disclosure also relates to a two-stage protection system. The two-stage protection system comprises a first protection stage and a second protection stage. The second protection stage is connected between a signal line and a supply line. The two-stage protection system further comprises a resistor positioned within the signal line between the first protection stage and the second protection stage.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

An embodiment of this disclosure relates to a nonlinear resistor based on velocity saturation, having a low resistance value for signal transmission current levels and a high resistance for ESD current levels. The nonlinear resistor is realised with a thin and highly doped diffusion embedded in a thicker and similarly highly doped well with different doping.

A diffusion resistor according to the disclosure has no snap-back. The resistor will be robust for high current densities because the filamentation will not occur. This is achieved with a resistor formed by a short, thin and highly doped layer embedded in a well of comparable doping level but with different polarity.

According to an embodiment of the disclosure, suitable implants are used to form a very thin diffusion layer, in a range of 0.1 µm, with a relatively high doping level, in a range of 10e18. A corresponding resistive layer is sandwiched between the surface of the silicon, which is covered with oxide, and a similarly highly doped well with different polarity.

Figure 2:
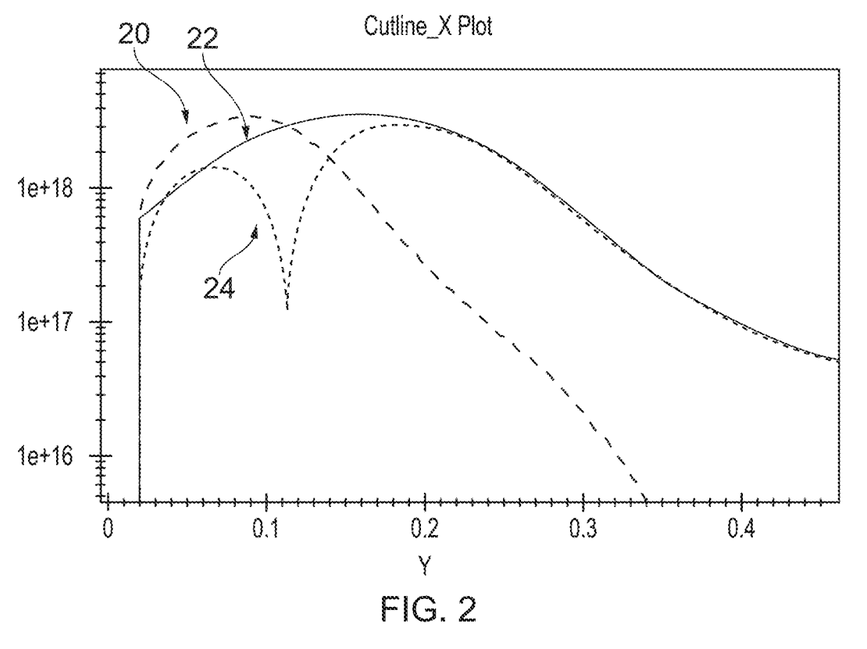
FIG. 2 illustrates a diagram related to an embodiment of the disclosure.

FIG. 2 shows the doping level when a boron is used 20, when a phosphorous doping is used 22 and absolute doping is used 24 showing junction at 0.1 µm.

Figure 3A:
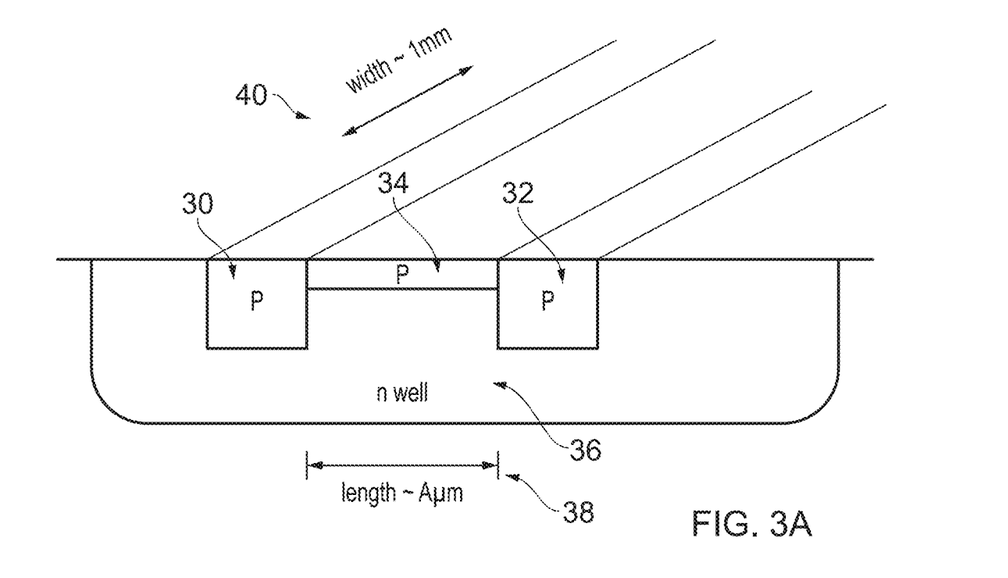
FIG. 3A illustrates an embodiment of the disclosure.
Figure 3B:
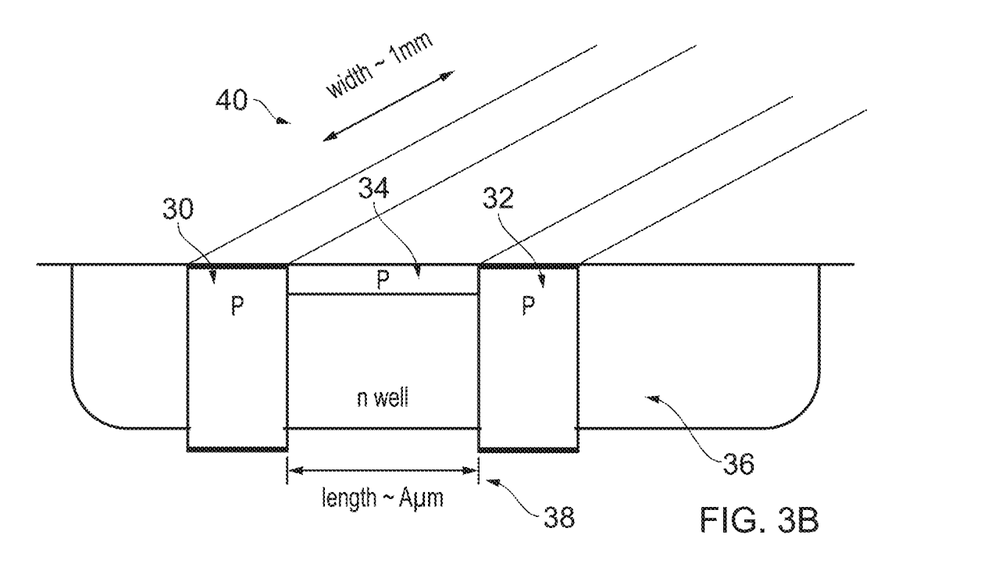
FIG. 3B illustrates and embodiment of the disclosure.

An embodiment of the disclosure is shown in FIGS. 3A-3B. In this embodiment a resistor 34 is contacted by two contact diffusions, a first contact diffusion 30 and a second contact diffusion 32. The length of the resistor 38, i.e. the distance between said contact diffusions is in a range of 1 to 2 µm. The total width of the resistor 40 is the parameter that defines the final resistance value. The total width of the resistor is in a range of 0.5 mm to 3 mm.

Figure 4:
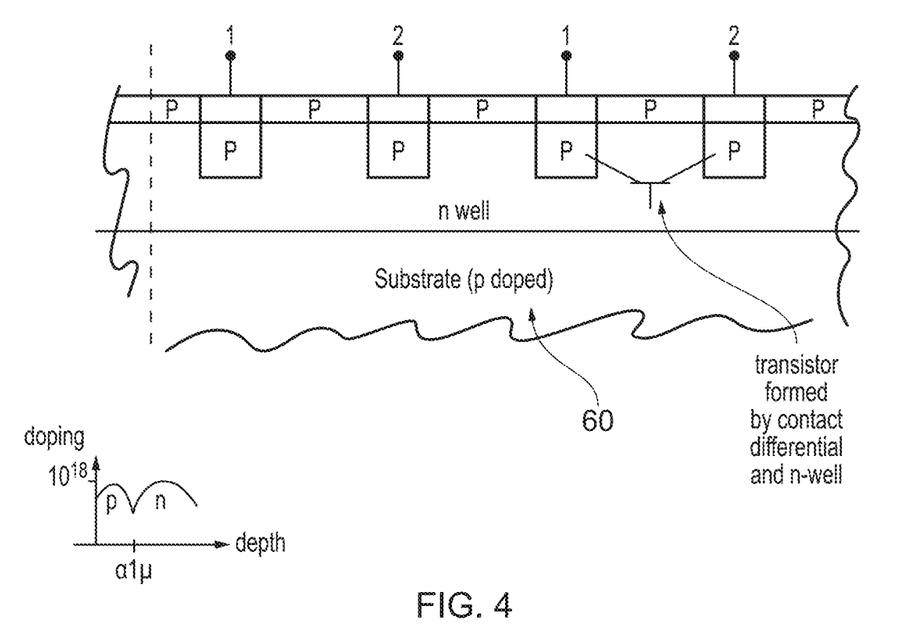
FIG. 4 illustrates an embodiment of the disclosure.

The resistor is best formed in a multi-finger arrangement. This is illustrated in FIG. 4. In such an arrangement current can flow from both sides of the contacts, effectively doubling the width of the resistor. The first contact diffusion 30 and the second contact diffusion 32 are positioned on the well 36. The well is positioned on a substrate 60.

In an embodiment of this disclosure, the first contact diffusion 30 and the second contact diffusion 32 are p-doped, the resistor 34 is p-doped, the well 36 is n doped and the substrate 60 is p-doped. The scope of the disclosure includes also an opposite doping arrangement, i.e. the first contact diffusion 30 and the second contact diffusion 32 are n-doped, the resistor 34 is n-doped, the well 36 is p doped and the substrate 60 is n-doped.

The contact diffusions 30 and 32 together with a well 36 form a bipolar transistor with floating base 52.

Figure 5:
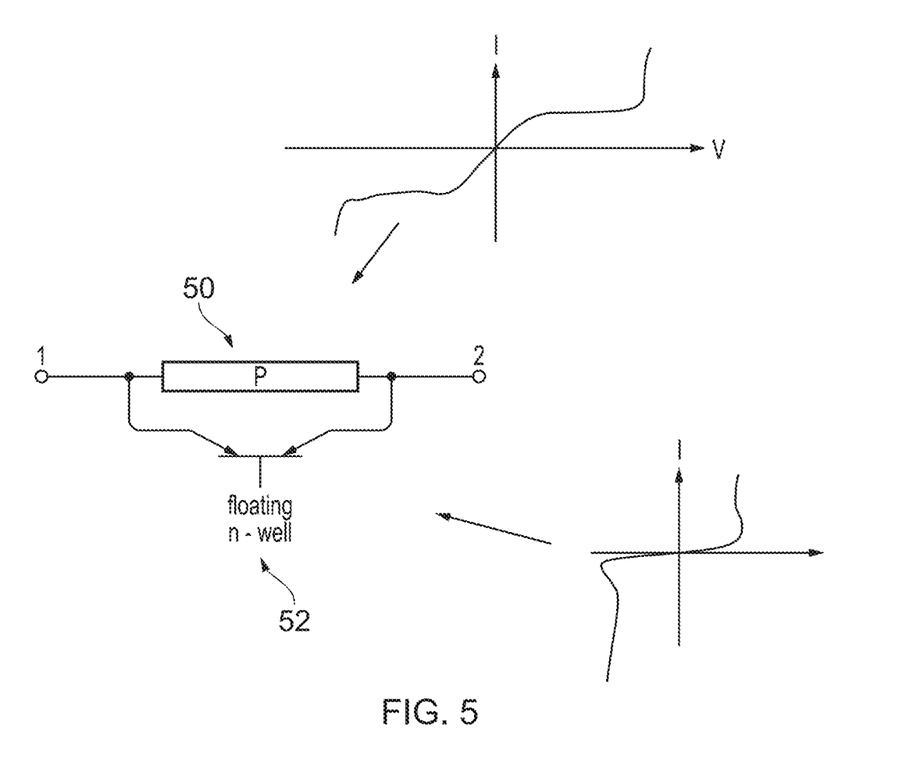
FIG. 5 illustrates an embodiment of the disclosure.

This transistor 52 is in parallel to the resistor 50. A breakdown voltage of the transistor is comparable to, or it is slightly smaller than a breakdown voltage of the resistor. This is shown in FIG. 5.

In another embodiment of the disclosure contacts are embedded within the resistive layer. The contacts can be made so that the contact diffusions are shallower than the resistive diffusion or the contacts can be made with salicidation.

Such a combination of a very thin two contact diffusion layers 30 and 32 and an underlying well 36 of a similar high doping level provides very good ESD protection.

Another advantageous feature of this embodiment of the disclosure is that the contact diffusion of the resistor forms a bipolar transistor with the underlying well whose breakdown voltage is similar to the breakdown voltage of the resistive layer. Contact diffusions 30 and 32 can be confined within the well 36.

When avalanche within the resistive layer starts at high enough voltages, minority carriers are injected into the resistive layer. These minority carriers cause snap back. This embodiment of the disclosure secures that most of the minority carriers do not stay within the resistive layer but get caught by the well below because the resistive layer is so thin. The lower well has a low resistance due to its high doping. Therefore, the trapped minorities can efficiently be drained away to one of the contacts.

Due to the effective trapping of minorities the snap back is smaller, which causes that the snap-back-voltage is higher.

Moreover, the contact diffusions together with the underlying well form a symmetrical bipolar junction transistor. If the breakdown voltage of this bipolar junction transistor is smaller than or comparable to the breakdown voltage of the resistor then the condition for avalanche within the resistor cannot be reached. In this way it is secured that there is no avalanche and no snap back.

The above described embodiments, i.e. the transient current suppressor, of the disclosure can be used within a signal line on a board. The transient current suppressor is placed between an outside connector, i.e. a socket, and the data-handling-integrated circuit.

Figure 6:
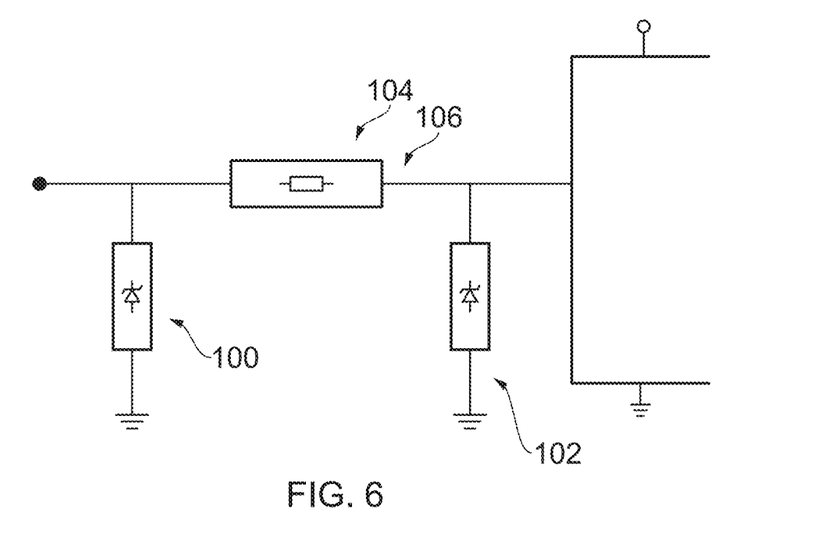
FIG. 6 illustrates an embodiment of the disclosure with a two-stage protection system.

Together with an additional on-board protection device placed between the transient current suppressor and the external socket the total system robustness is further improved. This arrangement presents a two stage protection system as shown in FIG. 6. The two-stage protection system comprises a first protection stage 100 and a second protection stage 102. The first protection stage 100 and second protection stage 102 are connected between a signal line 106 and a supply line. The two-stage protection system further comprises a resistor 104 positioned within the signal line 106 between the first protection stage 100 and the second protection stage 102.

The first protection stage 100 can be for example an on-board protection device or any other suitable device. The second protection stage 102 can be for example an internal electrostatic discharge protection structure in an integrated circuit or any other suitable device. A stress current is divided between a current through the first protection stage 100 and a current through the second protection stage 102. The internal protection structure of the IC can only survive a certain stress current. Therefore, the current through the second protection stage has to be minimized. The current through the second protection stage depends on the voltage drop across a resistor 104: the higher the voltage drop across the resistor the smaller the current through the second protection stage. A resistor according to the disclosure will present a large resistance value for a stress current and will therefore reduce the current through the second protection stage. For a given robustness of the second protection stage a larger stress can be applied when a resistor according to the disclosure is placed between the first protection stage and the second protection stage. This significantly improves the robustness of the system.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A discharge protection semiconductor structure comprising: a substrate; a well of a first polarity positioned on the substrate; a resistor of a second polarity embedded in the well, the second polarity being inversed in respect to the first polarity, the resistor having a top surface and a bottom surface; and a first contact diffusion of the second polarity and a second contact diffusion of the second polarity, the resistor being positioned between the first contact diffusion and the second contact diffusion, a top surface of the first contact diffusion and a top surface of the second contact diffusion being coplanar with the top surface of the resistor, and a bottom surface of the first contact diffusion and a bottom surface of the second contact diffusion being below the bottom surface of the resistor; wherein doping of the well, doping of the resistor, and doping of the first contact diffusion and second contact diffusion are of a similar level.

2. The discharge protection semiconductor structure as claimed in claim 1, further comprising:
the first contact diffusion and the second contact diffusion is positioned on a top side of the well.

3. The discharge protection semiconductor structure as claimed in claim 2, wherein the first contact diffusion and the second contact diffusion protrude into the well.

4. The discharge protection semiconductor structure as claimed in claim 2, wherein the first contact diffusion and the second contact diffusion protrude into the substrate below the well.

5. The discharge protection semiconductor structure as claimed in claim 1, wherein the well is p-doped, and wherein the resistor is n-doped.

6. The discharge protection semiconductor structure as claimed in claim 1, wherein the well is n-doped, and wherein the resistor is p-doped.

7. The discharge protection semiconductor structure as claimed in claim 1, wherein the resistor has a length that is in a range between 0.2 μm and 2 μm.

8. The discharge protection semiconductor structure as claimed in claim 1, wherein the resistor has a width that is in a range between 0.05 mm and 20 mm.

9. The discharge protection semiconductor structure as claimed in claim 1, wherein the resistor is doped in a range of 10e17 to 10e19, and wherein the resistor is of a thickness in a range of 0.01 μm to 0.5 μm.

10. The discharge protection structure as claimed in claim 1, wherein the resistor has a resistance between 0.2 and 10 Ohm for a mA current level.

11. The discharge protection semiconductor structure as claimed in claim 2, wherein the first contact diffusion and the second contact diffusion together with the well form a bipolar transistor with a floating base.

12. The discharge protection semiconductor structure as claimed in claim 11, wherein the bipolar transistor has a breakdown voltage comparable to a breakdown voltage of the resistor.

13. The discharge protection structure as claimed in claim 1, wherein the resistor is formed as a multi-finger arrangement.

14. The discharge protection structure as claimed in claim 2, wherein the resistor is formed as a multi-finger arrangement.

15. An integrated circuit comprising the discharge protection semiconductor structure as claimed in claim 1.

16. An integrated circuit comprising the discharge protection semiconductor structure as claimed in claim 2.

17. A method of creating a discharge protection semiconductor structure semiconductor as claimed in claim 1.

18. A method of creating a discharge protection semiconductor structure semiconductor as claimed in claim 2.

19. A two-stage protection system comprising: a first protection stage; a second protection stage connected between a signal line and a supply line; and a resistor positioned in the signal line between the first protection stage and the second protection stage, the resistor being positioned between a first contact diffusion and a second contact diffusion, the resistor being embedded in a well positioned on a substrate, the resistor having a top surface and a bottom surface, a top surface of the first contact diffusion and a top surface of the second contact diffusion being coplanar with the top surface of the resistor, and a bottom surface of the first contact diffusion and a bottom surface of the second contact diffusion being below the bottom surface of the resistor, wherein the well is of a first polarity, the resistor is of a second polarity, the second polarity being inversed in respect to the first polarity, and wherein doping of the well, doping of the first contact diffusion and the second contact diffusion, and doping of the resistor are of a similar level.

* * * * *